United States Patent [19]

Reid

[11] 4,002,968
[45] Jan. 11, 1977

[54] GROUND FAULT DETECTOR FOR A TWO-WIRE POWER SUPPLY

[75] Inventor: Ian Reid, Waterloo, Canada

[73] Assignee: General Signal Corporation, Rochester, N.Y.

[22] Filed: June 10, 1975

[21] Appl. No.: 585,547

[52] U.S. Cl. .............................. 324/51; 324/DIG. 1; 340/255

[51] Int. Cl.[2] ...................................... G01R 31/02

[58] Field of Search ............ 324/51, 98, 62 R, 140, 324/DIG. 1; 317/18 D; 340/255, 248 A

[56] References Cited

UNITED STATES PATENTS

| | | | |
|---|---|---|---|
| 1,931,054 | 10/1933 | Butterfield | 324/62 R |
| 2,131,386 | 9/1938 | Mishelevich | 340/255 |
| 2,362,562 | 11/1944 | Kelly | 324/62 R |
| 2,448,461 | 8/1948 | Postal | 324/62 R |
| 2,623,107 | 12/1952 | Baughman | 340/255 |
| 2,648,819 | 8/1953 | Gustafsson | 324/62 R |
| 2,891,218 | 6/1959 | Werts | 324/62 R |
| 2,934,699 | 4/1960 | Offner | 324/DIG. 1 |
| 2,958,823 | 11/1960 | Rabier | 324/98 X |
| 2,999,231 | 9/1961 | Kusters et al. | 340/255 |
| 3,066,284 | 11/1962 | McKinley et al. | 340/255 |
| 3,377,552 | 4/1968 | Baum | 324/51 |
| 3,569,826 | 3/1971 | Burnett | 324/51 |
| 3,801,898 | 4/1974 | Young | 324/51 |

Primary Examiner—Gerard R. Strecker
Attorney, Agent, or Firm—Milton E. Kleinman; George W. Killian

[57] ABSTRACT

Techniques are disclosed for detecting and responding to a ground fault on either side of a two wire filtered, or unfiltered, power supply. A first voltage divider is bridged across the lines of the power supply and an intermediate point is grounded. A second voltage divider is bridged across the lines and two intermediate junctions provided. First and second voltage responsive means are coupled from ground to the first and second junctions of said second voltage divider, respectively, for comparing the potentials between the coupled points and providing an alarm in response to a variation indicative of a ground fault on either line below a predetermined threshold impedance. Filtering may be used to reduce the sensitivity of the system to noise or extraneous signals on the line. The sensitivity of the entire system and/or either line to ground may be adjusted by changing the relative values of the elements of the voltage dividers. The elements of the voltage dividers may be compared with the arms of a variation of the Wheatstone bridge.

9 Claims, 1 Drawing Figure

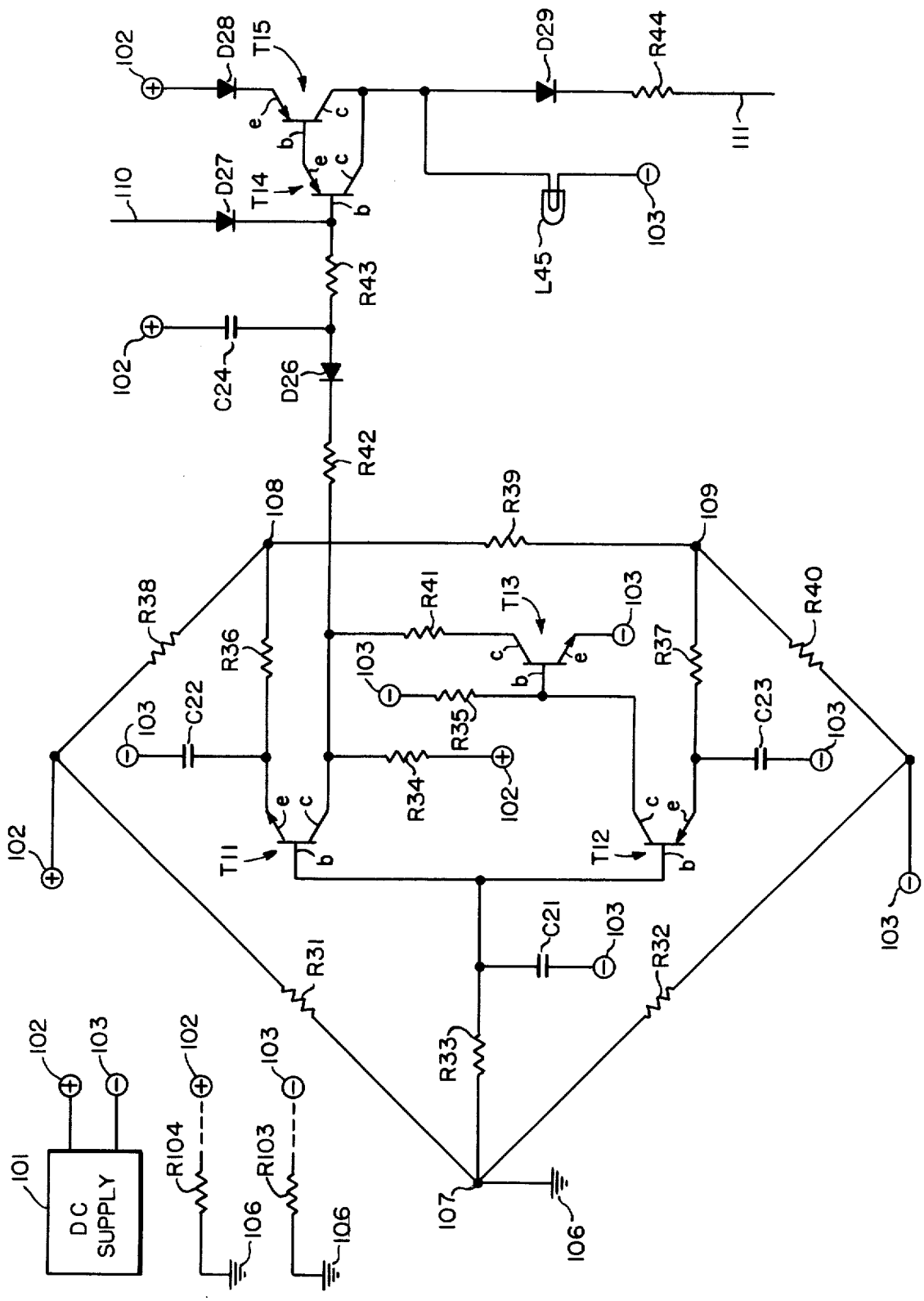

4,002,968

GROUND FAULT DETECTOR FOR A TWO-WIRE POWER SUPPLY

BACKGROUND OF THE INVENTION

There are numerous situations wherein it is desirable to know if there is an undesired or unauthorized impedance to ground on internal and/or external wiring of electrical power supply systems and to provide an alarm signal when ground faults are detected. Ground fault detection systems are used to protect equipment and/or personnel in a wide variety of applications and to assure continuous and accurate operation of the equipment. One typical example of a power supply system which it is vital to maintain in operative condition is the pair which provides power to alarms which sound in response to the detection of fire, smoke or other abnormal conditions.

Because the detection of ground faults is important, a wide variety of techniques have been developed for their detection. Some prior art techniques, particularly those employing relays, were not sufficiently sensitive. Prior art solid state techniques often tended to be too sensitive and responded to noise or line fluctuations. In some applications it is desirable to have symmetrical sensitivity to both sides of the power supply. Many prior art systems failed to provide the desired symmetrical sensitivity. Some systems were more sensitive than desired with respect to capacitance between system wiring and ground. Also, some prior art systems had an inherent threshold of sensitivity and could not easily be adjusted to be more or less sensitive to meet the requirements of a particular application.

SUMMARY OF THE INVENTION

The invention employs a pair of voltage dividers, or what may be thought of as a specialized form of a Wheatstone bridge, for providing a plurality of junction points which will have a predetermined voltage relationship under normal operating conditions. One of the junction points is coupled to ground in order to provide a known reference. In normal applications of the invention, there will be two other junction points and voltage comparing circuits will be coupled from ground to each of the junction points. If a false ground appears on either side of the power supply, the potential relationship between ground and at least one of the junction points will be altered and the comparator coupled thereto will produce an output signal. The sensitivity of the system may be altered by changing the value of the impedance in the voltage dividers and/or by changing their relative values. Appropriate modifications in resistance value can make the system unsymmetrical, thereby, making it more sensitive to ground faults on one side than on the other. Filter networks are provided for reducing sensitivity to line noise and/or extraneous line signals. Means are also provided for inhibiting the extension of trouble signals, if desired.

It is an object of the invention to provide a new and improved circuit for detecting and responding to ground faults.

It is another and more specific object of the invention to detect and respond to ground faults on either or both sides of a power supply line.

It is another object of the invention to provide a ground fault detecting system whose sensitivity may be adjusted over wide limits.

It is another object of the invention to provide a ground fault sensing system for a power supply which may have equal or unequal sensitivity with respect to ground faults on the two lines of the power supply.

It is another object of the invention to provide a ground fault detector which is relatively insensitive to noise and extraneous signals.

BRIEF DESCRIPTION OF THE DRAWING

The drawing comprises a single FIGURE which constitutes a schematic circuit of one embodiment of the invention. It should be noted that all points designated + are coupled together and that in like manner all points designated − are coupled together.

DESCRIPTION OF THE PREFERRED EMBODIMENT

The ground fault detecting system is incorporated in the circuit shown in the drawing in which conventional symbols are used to illustrate a plurality of resistors, capacitors, diodes, transistors and an incandescent lamp. The system is designed to detect and respond to ground faults between ground and either side of a filtered or unfiltered d.c. power supply. In order to simplify the drawing, all terminals which are connected to the positive leg of the d.c. power supply are designated by a circled + symbol. In a similar manner, all terminals which are coupled to the negative side of the d.c. power supply are indicated by a circled − symbol. As a convenience to the reader, all identifying numbers which refer to a particular circuit element are preceded by a letter indicative of the element. For example, the prefix R identifies a resistor; C a capacitor; D a diode and T a transistor. Any of the elements designated with an R prefix may include a reactive component.

Considering now more specifically the circuit of the drawing, there will be seen a d.c. power supply 101 which may constitute either a filtered or unfiltered source of d.c. potential. The d.c. power supply 101 has a positive terminal 102 and a negative terminal 103. As indicated, all leads connected to the positive terminal 102 are designated with a circled + and since all such symbols are connected in common, they are all designated 102 herein. In a similar manner, all leads terminating with a circled − are coupled to the negative lead of the d.c. power supply 101 and are designated 103. In some power supply systems, one or the other of the power leads may be coupled directly to ground. The d.c. power supply 101 does not have either its positive lead 102 or its negative lead 103 coupled directly to ground. The circuit provides an indication if it detects that either the positive lead 102 or the negative lead 103 is connected directly, or through an impedance, to ground. A possible false impedance to ground from the positive lead 102 is indicated by resistor R104; and a similar false impedance to ground from the negative terminal 103 is indicated by resistor R103. The left side of the resistors R104 and R103 is shown as connected to ground 106. The dotted line from the resistors R104 and R103 to the positive and negative leads, respectively, indicate that the impedance represented by the resistor may or may not be coupled between ground 106 and the terminals 102 or 103 of the power supply 101.

The circuit will be seen to include five transistors designated T11, T12, T13, T14 and T15, each of which has a base, emitter and collector electrode which are indicated by the letters b, e and c, respectively. The transistors T11 and T13 will be seen to be of the NPN variety while the transistors T12, T14 and T15 are of the PNP variety. An NPN transistor must have its base positive with respect to its emitter to allow conduction from the collector to the emitter, while a PNP transistor must have its base negative with respect to the emitter in order to allow conduction from the emitter to the collector.

The circuit also includes four capacitors designated C21, C22, C23 and C24. The first three of these capacitors have one of their sides coupled to the negative side 103 of the d.c. power supply 101 and the capacitor C24 has one of its terminals connected to the positive side 102 of the d.c. power supply 101.

The circuit also includes a plurality of resistors designated R31 through R44 each of which has a function to be described more fully hereinafter. The circuit also includes four diodes designated D26 through D29. In addition, the circuit includes an incandescent lamp designated L45 for visually indicating the presence of a ground fault.

Resistors R31 and R32 will be seen to be coupled in series between the positive terminal 102 and the negative terminal 103 of the d.c. supply 101 and the junction of these resistors will be seen to be coupled to ground 106 at junction point 107. Resistors R38, R39 and R40 will be seen to be coupled in series, in the order named, between the positive terminal 102 and the negative terminal 103. The junction between resistors R38 and R39 forms junction point 108 and the junction between resistors R39 and R40 forms junction point 109. The resistors R31 and R32 comprise a first voltage divider coupled between the power supply leads 102 and 103. The resistors R31 and R32 will typically (but not necessarily) have the same resistance value, thereby making the positive terminal 102 and the negative terminal 103 have equal positive and negative potentials with respect to ground potential 106 at junction point 107. The resistors R38, R39 and R40 will be seen to provide a second voltage divider between the terminals 102 and 103. Typically (but not necessarily) the resistors R38 and R40 will have the same value which typically will differ from that of R39. Accordingly, it will be seen that the junction points 108 and 109 will normally be at an equal positive and negative potential with respect to the ground potential 106 at junction 107. Or, expressed differently, the junction point 108 will be at a positive potential with respect to ground 106, but at a negative potential with respect to the positive lead 102. In a like manner, the junction point 109 will be at a negative potential with respect to ground 106, but at a positive potential with respect to the negative lead 103. The recited potentials and their relationship, one to another, are based upon the assumption that there is no false ground on the leads 102 and/or 103. Or, expressed differently, it is based on the assumption that the resistors R103 and R104 are infinite. For any given situation with a known potential of the d.c. power supply 101 and the value of the resistors, it would be a simple matter to apply Ohm's law to determine potentials of junction points 108 and 109. Should the resistor R104 have a value less than infinity, it will be seen that it is, in effect, in parallel with resistor R31 and that this reduces the net effective value of resistor R31, thereby changing the net effect of the voltage divider comprising resistors R31 and R32. As a consequence, the difference in potential between the ground 106 at junction point 107 and the lead 102 will be altered. At the same time, the potential difference between the junction point 107 and the negative lead 103 will be increased because of the increased flow of current in resistor R32 and the consequent increased IR drop in the resistor R32. Because of these changes, the relationship between the potentials of junction points 107 and 108 and the relationship of the potential between junction points 107 and 109 will be altered. It will be shown that the circuit is sensitive to these altered changes in potential relationship between the junction points.

A false ground R103 coupled to the lead 103 will, in effect, be in parallel with resistor R32 and will cause results similar to those identified above when resistor R104 was considered to be in parallel with resistor R31. More specifically, the false ground R103 will cause a reduced difference in potential between the junction point 107 and the lead 103 and an increased potential difference between the junction point 107 and the lead 102. While reference has been made to R104 and R103 as resistors, it should be understood that they may comprise any form of impedance.

The layout of that portion of the circuit comprising resistors R31, R32, R38, R39 and R40 is suggestive of a bridge circuit. In a more normal bridge, there would be only two resistors instead of the three resistors R38, R39 and R40. The circuit may be analyzed by considering it as a specialized form of a Wheatstone bridge arrangement.

Under normal conditions with resistors R104 and R103 having an infinite value, the bases b of the transistors T11 and T12 will be connected to ground 106 at junction point 107 through resistor R33. The emitter e of transistor T11 will be connected to junction point 108 through resistor R36. Since junction point 108 is slightly positive with respect to ground 106, the emitter e of transistor T11 is positive with respect to the base and, therefore, since the transistor T11 is of the NPN type, it will not be conducting. That is, an NPN transistor is conducting only when the base is positive with respect to the emitter.

The emitter e of transistor T12 is coupled through resistor R37 to junction point 109 and junction point 109 is slightly negative with respect to ground 106. Accordingly, the emitter e of transistor T12 is negative with respect to the base and since transistor T12 is of the PNP type, it will not conduct unless the base is negative with respect to the emitter. Both the base and the emitter of transistor T13 are at the negative potential 103 and, therefore, this transistor is not conducting.

The darlington circuit comprising transistors T14 and T15 does not turn on as the positive potential 102 is applied to the emitter e of transistor T15 through diode D28 and to the base b of the transistor T14 through R43, R42 and R43. For the present, any potential on lead 110 will be ignored except to indicate that this lead may be used to provide a potential to the base of transistor T14 for the purpose of maintaining it in the off state. Without the transistor T15 conducting, no current can flow therethrough to illuminate lamp L45. In summary, when the false ground R104 and/or R103 are not coupled to either the positive lead 102 or the negative lead 103, none of the transistors of the circuit are conducting.

It will now be assumed that resistor R104 has a value less than infinity coupled directly to the positive power supply lead 102 and for the purposes of simplified circuit analysis, it will be assumed that resistance R104 has a value of 0 ohms. That is, there is a direct ground 106 coupled to the positive power supply lead 102. This means that, in effect, the resistance R31 is shorted out and that the negative lead 103 is at a potential below ground 106 which is equal to the potential of the d.c. supply 101. Under these conditions, it will be seen that the base b of transistor T12 is still positive with respect to the emitter e and that, therefore, there will be no conduction from emitter to collector of the transistor T12. However, the junction point between resistors R31 and R38 is now considered to be at ground potential and, therefore, the junction point 108 has a potential which is negative with respect to ground 106. Accordingly, the base b of transistor T11 is positive with respect to the emitter e and current will flow from the ground which is coupled to terminal 102 through resistor R34 and the collector to emitter circuit of transistor T11 through resistor R36 to the junction 108 which is at a negative potential with respect to the ground on terminal 102. As a result of this current flow, the collector c of transistor T11 will have a negative potential and this potential will be applied to the base b of the darlington transistor T14. As a consequence, the darlington pair T14 and T15 will turn on, and current from terminal 102 can flow through diode D28 and the emitter to collector circuit of transistor T15 to illuminate the lamp L45 and thereby indicate the nonstandard condition. A signal may also be applied through diode D29 and resistor R44 to lead 111 for extending an alarm signal to a remote location.

Analysis will show that if R104 has some value between 0 ohms and infinity, substantially the same thing will happen until the value of R104 exceeds some threshold value. The threshold value will be the limit of the sensitivity of the circuit and may be adjusted either upward or downward by modifying the values of the various resistors, most particularly including R31, R32, R38, R39 and R40.

Consideration will now be given to the circuit operation when there is a false ground on the negative side 103 of the power supply. For convenience in circuit analysis, it will be assumed tht the false ground is a direct ground and that the terminal 103 is at ground potential 106. Under these conditions, the positive terminal 102 will be at a positive potential, with respect to ground 106, which is equal to the voltage of the d.c. power supply 101. With the terminal 103 at ground potential 106, the junction point 109 will be at a positive potential with respect to ground and, therefore, emitter e of transistor T12 will be positive with respect to the base b, and the transistor T12 will turn on with current flowing from the positive potential at junction 109 through resistor R37 and the emitter to collector circuit of transistor T12 to the false ground on the other side of resistor R35. This current flow will place a slightly positive potential at the base b of transistor T13 and since the emitter e of transistor T13 is now at ground potential, since there is a false ground coupled to terminal 103, the conditions are met for turning on transistor T13; and current can flow from the positive terminal 102 through resistors R34 and R41 and the collector to emitter circuit of transistor T13 to the false ground at terminal 103. As a result of this current flow, the base b of transistor T14 will be negative with respect to the positive potential on the far side of diode D28 and, therefore, the darlington pair T14 and T15 will turn on with the results previously mentioned.

As in the case with the false ground on the positive terminal, the resistance R103 may be considered as having a value greater than 0 ohms and less than infinity and the circuit will function as described until the magnitude of the resistance R103 exceeds some critical threshold value. The magnitude of the threshold value may be altered by changing various resistors and/or their ratios, most particularly including resistors R31, R32, R38, R39 and R40.

If false grounds R104 and R103 should exist simultaneously, one or the other of the transistors T11 or T12 will turn on with the results described above. The one of the transistors T11 or T12 which turns on, will be determined by the relative magnitudes of the resistors R104 and R103 and the magnitude and relationships of the resistors R31, R32, R38, R39 and/or R40. Analysis will show that with R31 equal to R32 and R104 equal to R103, the system is balanced and no fault will be indicated. Balanced faults of this type are rare.

The resistor and capacitor pairs R33-C21; R36-C22; and R37-C23 help to stabilize the circuit and reduce the sensitivity of the system so that it will not indicate an alarm condition in response to noise and/or extraneous signals on the power supply leads 102 and/or 103. The RC networks are all shown connected to negative terminal 103, however, it would be equally effective to connect them to positive terminal 12. All must have the same termination to provide effective stabilization.

Resistor R39 spreads the threshold level of transistors T11 and T12 so that normal circuit tolerance will not tend to cause a false signal.

In general, the sensitivity of the sytem may be increased by increasing the values of resistors R31 and R32. If R31 and R32 have equal values and R38 and R40 have equal values, the system will have symmetrical sensitivity. That is, the system will be equally sensitive to false grounds on either the positive or negative leads. By suitable modifications of these resistors, more or less sensitivity and unsymmetrical sensitivity may be obtained if desired. For symmetrical sensitivity and sensitivity from zero to about 50,000 ohms, the following components and the values may be used:

| Element | Designation or Value |
| --- | --- |
| T11, T13 | 2N3417 |
| T12 | 2N5366 |
| T14, T15 | D29E401 |
| C21, C22, C23 | 47 microfarads 63 volts |
| C24 | 33 microfarads 16 volts |
| R31, R32 | 39,000 ohms |
| R34, R35, R41 | 100,000 ohms |
| R33, R36, R37, R38, R40 | 10,000 ohms |
| R39 | 4,700 ohms |
| R42, R43 | 15,000 ohms |
| R44 | 22,000 ohms |

It will be apparent that the transistor T11 and its associated circuitry comprises a voltage comparing means for comparing the voltage difference between junction points 107 and 108 and that a variety of other potential comparing means might be provided. In a similar manner, transistor T12 and its associated circuity comprises a comparator for comparing the voltage difference between junction points 107 and 109 and for providing a signal in response to a predetermined voltage difference. Other voltage comparing means including vacuum tubes could be used.

It was mentioned that lead 110 could be used to apply a signal to maintain the darlington pair T14 and T15 in the off condition. Normally, no signal would be applied to lead 110 and the system would be allowed to illuminate lamp L45 and extend a signal on lead 111 in response to a false ground. However, it should be noted that a false ground on either, but not both, the terminals 102 and 103 would not normally interfere with satisfactory operation of the power supply 101. In fact, a high impedance false ground on both terminals 102 and 103 would not totally destroy the usefulness of the power supply 101. As suggested previously, a typical use of power supply 101 is to operate alarm signals indicative of nonstandard conditions such as smoke or fire. The occurence of a smoke or fire condition is normally considered a matter of considerable emergency. Accordingly, in order to focus attention on the emergency condition, it is customary to disable subordinate alarms. Thus, in response to a smoke or fire alarm, a signal may be placed on lead 110 to inhibit the false ground alarm by maintaining the darlington pair T14 and T15 in the off state.

While there has been shown and described what is considered at the present to be the preferred embodiment of the invention, modifications thereto will readily occur to those skilled in the related arts. Other voltage comparators including silicon controlled rectifiers might be substituted. It is believed that no further analysis or description is required and that the foregoing so fully reveals the gist of the present invention that those skilled in the applicable arts can adapt it to meet the exigencies of their specific requirements. It is not desired, therefore, that the invention be limited to the embodiments shown and described, and it is intended to cover in the appended claims all such modifications as fall within the true spirit and scope of the invention.

What is claimed is:

1. Circuit means for responding to a ground fault on the first or second lead of a two wire d.c. power supply and comprising in combination:
   a. a first voltage divider having first and second fixed resistive elements coupled in series and bridged between said first and second leads of said d.c. power supply and with the junction of said first and second fixed resistive elements coupled to ground;
   b. a second voltage divider having third, fourth and fifth resistive elements coupled in series and bridged between said first and second leads and with the junction of said third and fourth resistive elements and said fourth and fifth resistive elements forming first and second junction points, respectively; and
   c. first and second potential comparators coupled between said ground and said first and second junction, respectively, for responding to the occurrence of a potential difference, exceeding a predetermined threshold value, between said ground and said first or second junction, respectively, when a ground fault appears on said first or second lead, respectively, of said d.c. power supply.

2. The combination as set forth in claim 1 and including first filter means coupled from ground to a selected one of said first and second leads; second filter means coupled from said first junction to said selected lead; and third filter means coupled from said second junction to said selected lead for reducing the sensitivity of said first and second potential comparators to stray signals on said first and second leads.

3. The combination as set forth in claim 1, wherein said first and second comparators each include a transistor having its base electrode coupled to ground and its emitter electrode coupled to said first and second junctions, respectively.

4. The combination as set forth in claim 3 and wherein the collector electrode of the transistors of said first and second comparators is coupled to said first and second leads, respectively.

5. The combination as set forth in claim 4, wherein the transistors of said first and second comparators are NPN and PNP types, respectively.

6. The combination as set forth in claim 1, wherein said first and second comparators each comprise normally nonconducting semiconductor devices which are triggered into conduction in response to a shunt below a predetermined threshold value coupled between the ground and one of said first and second leads of said power supply.

7. The combination as set forth in claim 6, wherein said third, fourth and fifth arms constitute a voltage divider for biasing said semiconductors.

8. The combination as set forth in claim 7, wherein the magnitude of the impedance of said arms influences the threshold value of the shunts which will trigger said semiconductor devices into conduction.

9. The combination as set forth in claim 8, wherein the relative magnitudes of the impedance of said third, fourth and fifth arms may be adjusted to cause said first and second comparators to be triggered into conduction in response to first and second different maximum shunt values, respectively.

* * * * *